United States Patent
Feng et al.

(10) Patent No.: US 10,396,073 B2
(45) Date of Patent: Aug. 27, 2019

(54) SEMICONDUCTOR DEVICE AND METHOD FOR FABRICATING THE SAME

(71) Applicants: UNITED MICROELECTRONICS CORP., Hsin-Chu (TW); Fujian Jinhua Integrated Circuit Co., Ltd., Quanzhou, Fujian province (CN)

(72) Inventors: Li-Wei Feng, Kaohsiung (TW); Chien-Ting Ho, Taichung (TW); Shih-Fang Tzou, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 25 days.

(21) Appl. No.: 15/610,642

(22) Filed: Jun. 1, 2017

(65) Prior Publication Data
US 2018/0323190 A1 Nov. 8, 2018

(30) Foreign Application Priority Data

May 4, 2017 (CN) .......................... 2017 1 0307435

(51) Int. Cl.
H01L 27/088 (2006.01)
H01L 29/06 (2006.01)
H01L 29/423 (2006.01)
H01L 29/66 (2006.01)
H01L 27/108 (2006.01)
H01L 21/8234 (2006.01)

(52) U.S. Cl.
CPC .... *H01L 27/088* (2013.01); *H01L 21/823456* (2013.01); *H01L 21/823481* (2013.01); *H01L 27/10823* (2013.01); *H01L 27/10876* (2013.01); *H01L 29/0649* (2013.01); *H01L 29/4236* (2013.01); *H01L 29/66666* (2013.01)

(58) Field of Classification Search
None
See application file for complete search history.

(56) References Cited

U.S. PATENT DOCUMENTS

2007/0224756 A1* 9/2007 Lee .................. H01L 27/10894 438/243
2015/0048456 A1* 2/2015 Chuang ........... H01L 21/823828 257/368
2015/0194438 A1* 7/2015 Kim .................. H01L 27/10876 257/324

OTHER PUBLICATIONS

"topmost." Merriam-Webster.com. 2019. https://www.merriam-webster.com (Jan. 23, 2019).*
Lee, Title: DRAM Life Extension Challenge and Response; 2015 IEDM Short Course, Dec. 6, 2015.
Yang, Title: Suppression of Row Hammer Effect by Doping Profile Modification in Saddle-Fin Array Devices for sub-30-nm DRAM Technology; IEEE Electron Device Letters, 2016.

* cited by examiner

*Primary Examiner* — Jay C Chang
(74) *Attorney, Agent, or Firm* — Winston Hsu

(57) ABSTRACT

A method for fabricating semiconductor device includes the steps of first forming a first trench and a second trench in a substrate and then forming a shallow trench isolation (STI) in the first trench, in which the STI comprises a top portion and a bottom portion and a top surface of the top portion is even with or higher than a bottom surface of the second trench. Next, a conductive layer is formed in the first trench and the second trench to form a first gate structure and a second gate structure.

5 Claims, 3 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for fabricating a dynamic random access memory (DRAM) device.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a method for fabricating semiconductor device includes the steps of first forming a first trench and a second trench in a substrate and then forming a shallow trench isolation (STI) in the first trench, in which the STI comprises a top portion and a bottom portion and a top surface of the top portion is even with or higher than a bottom surface of the second trench. Next, a conductive layer is formed in the first trench and the second trench to form a first gate structure and a second gate structure.

According to another aspect of the present invention, a semiconductor device includes: a first gate structure in a substrate; a second gate structure in the substrate and adjacent to the first gate structure; and a shallow trench isolation (STI) under the first gate structure. Preferably, the STI comprises a top portion and a bottom portion and a top surface of the top portion is even with or higher than a bottom surface of the second gate structure.

According to yet another aspect of the present invention, a semiconductor device includes a shallow trench isolation (STI) in a substrate. Preferably, the STI includes a bottom portion and a top portion on the bottom portion, in which a top surface of the top portion is even with or higher than the top surface of the substrate and a top surface of the bottom portion is lower than the top surface of the substrate.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
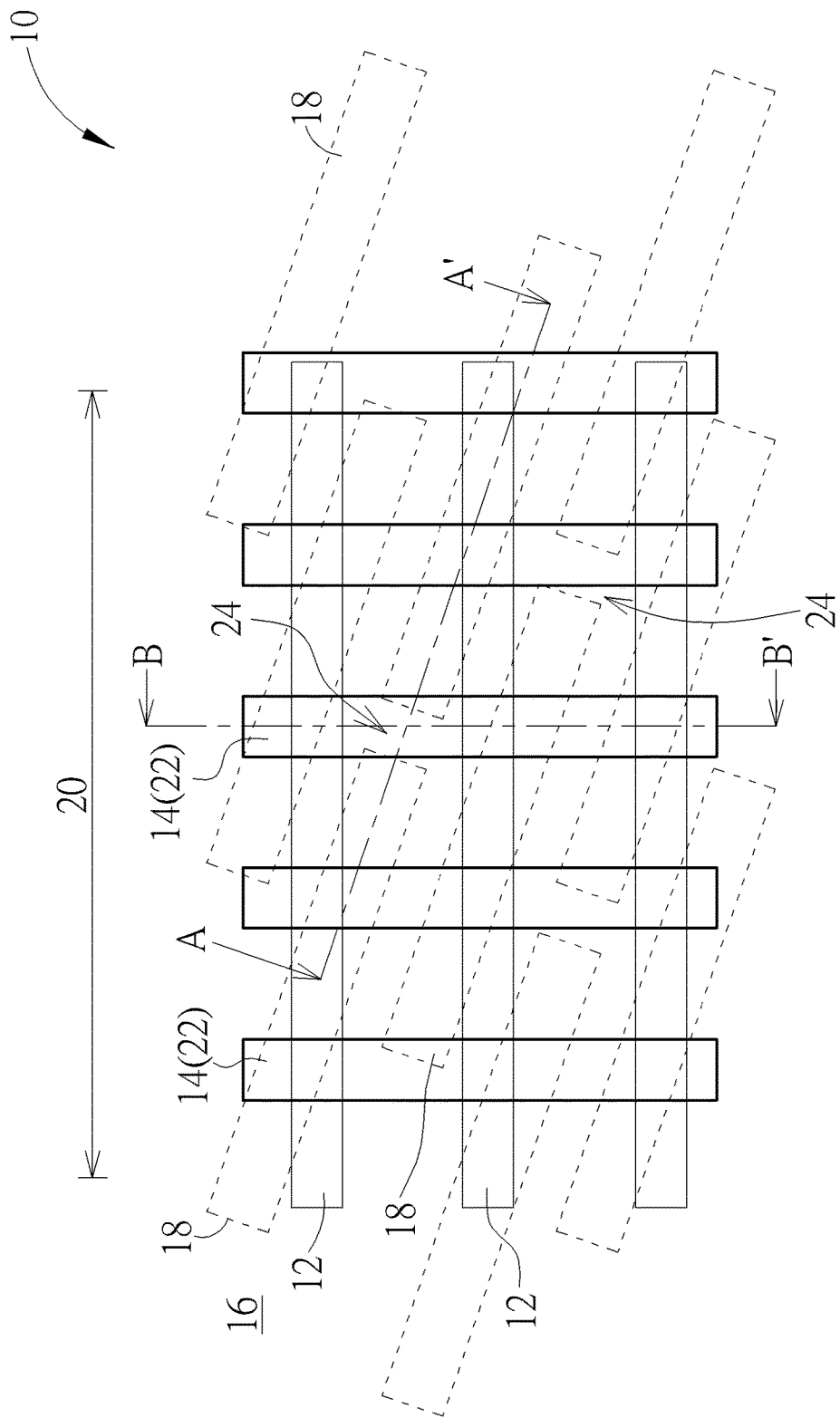
FIGS. 1-5 illustrate a method for fabricating a DRAM device according to an embodiment of the present invention.
Figure 2:
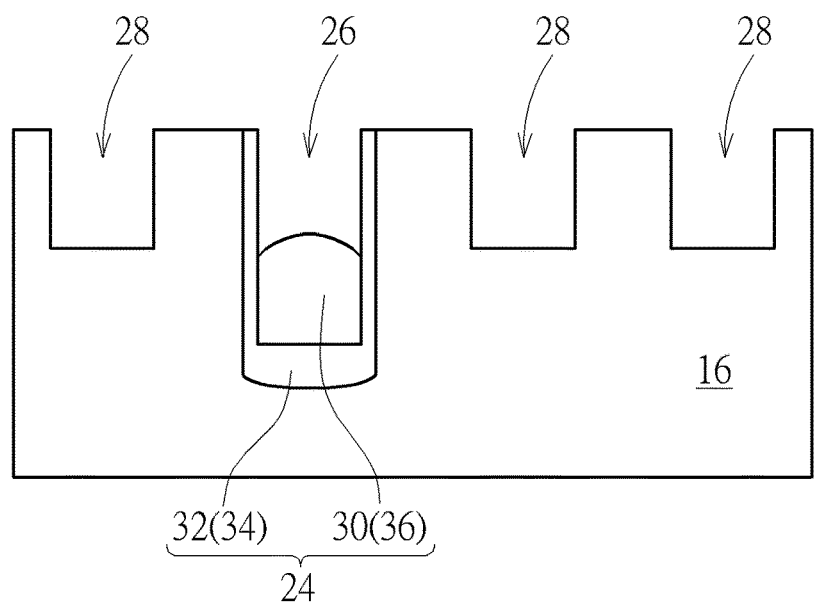
Figure 3:
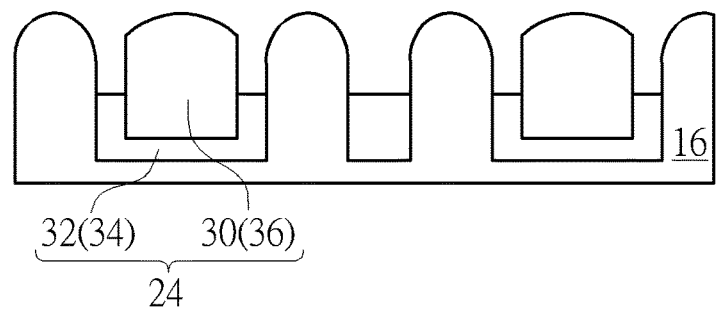
Figure 4:
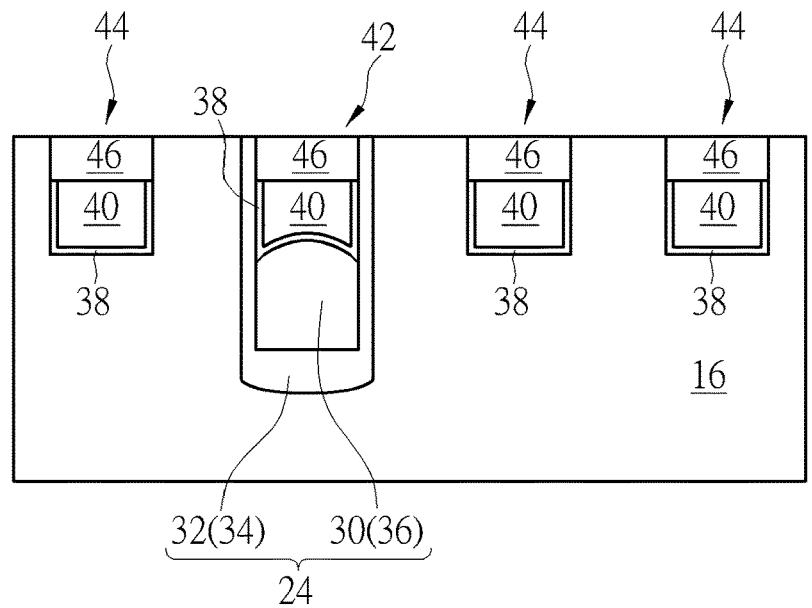
Figure 5:
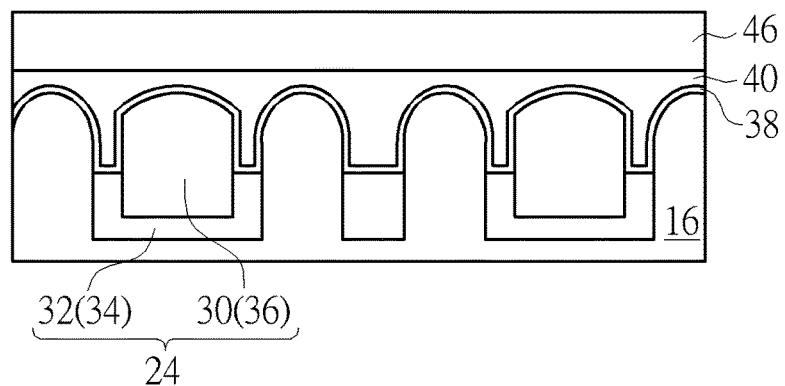

Referring to FIGS. 1-5, FIGS. 1-5 illustrate a method for fabricating a DRAM device according to an embodiment of the present invention, in which FIG. 1 illustrates a top-view diagram, FIG. 2 illustrates a cross-sectional view of FIG. 1 along the sectional line AA', FIG. 3 illustrates a cross-sectional view of FIG. 1 along the sectional line BB', FIG. 4 illustrates a cross-sectional view following the fabrication of FIG. 2, and FIG. 5 illustrates a cross-sectional view following the fabrication of FIG. 3. Preferably, the present embodiment pertains to fabricate a memory device, and more particularly a DRAM device 10, in which the DRAM device 10 includes at least a transistor device (not shown) and at least a capacitor structure (not shown) that will be serving as a smallest constituent unit within the DRAM array and also used to receive electrical signals from bit lines 12 and word lines 14.

As shown in FIG. 1, the DRAM device 10 includes a substrate 16 such as a semiconductor substrate or wafer made of silicon, a shallow trench isolation (STI) 24 formed in the substrate 16, and a plurality of active areas (AA) 18 defined on the substrate 16. A memory region 20 and a periphery region (not shown) are also defined on the substrate 16, in which multiple word lines 14 and multiple bit lines 12 are preferably formed on the memory region 20 while other active devices (not shown) could be formed on the periphery region. For simplicity purpose, only devices or elements on the memory region 20 are shown in FIG. 1 while elements on the periphery region are omitted.

In this embodiment, the active regions 18 are disposed parallel to each other and extending along a first direction, the word lines 14 or multiple gates 22 are disposed within the substrate 16 and passing through the active regions 18 and STI 24. Preferably, the gates 22 are disposed extending along a second direction, in which the second direction crosses the first direction at an angle less than 90 degrees.

The bit lines 12 on the other hand are disposed on the substrate 16 parallel to each other and extending along a third direction while crossing the active regions 18 and STI 24, in which the third direction is different from the first direction and orthogonal to the second direction. In other words, the first direction, second direction, and third direction are all different from each other while the first direction is not orthogonal to both the second direction and the third direction. Preferably, contact plugs such as bit line contacts (BLC) (not shown) are formed in the active regions 18 adjacent to two sides of the word lines 14 to electrically connect to source/drain region (not shown) of each transistor element and storage node contacts (not shown) are formed to electrically connect to a capacitor.

The fabrication of word lines 14 (or also referred to as buried word lines) is explained below. As shown in FIGS. 2-3, a first trench 26 is formed in the substrate 16, a shallow trench isolation (STI) 24 is formed in the first trench 26, and at least a second trench, such as second trenches 28 are formed adjacent to the first trench 26. Preferably, the STI 24 includes a top portion 30 and a bottom portion 32 and the top surface of the top portion 30 is even with or higher than the bottom surface of the second trench 28.

Specifically, the formation of the STI 24 could be accomplished by first forming the first trench 26 and then sequentially forming a liner 34 and a dielectric layer 36 in the first trench 26. Next, a patterned mask (not shown) is formed on the substrate 16 to expose part of the first trench 26 and part of the substrate 16 surface adjacent to the first trench 26, and an etching process is conducted by using the patterned mask as mask to remove part of the liner 34 and part of the dielectric layer 36 within the first trench 26 and at the same time remove part of the substrate 16 adjacent to the first trench 26 to form second trenches 28. Preferably, the remaining dielectric layer 36 after the etching process becomes the top portion 30 of the STI 24 while the remaining liner 34 becomes the bottom portion 32 of the STI 24.

In this embodiment, the liner 34 and the dielectric layer 36 are preferably made of different material, in which the liner 34 in this embodiment is preferably made of silicon oxide while the dielectric layer 36 is made of silicon nitride. Preferably, an etchant of the aforementioned etching process is selected from the group consisting of $CH_3F$ and $O_2$, and an etching selectivity of silicon oxide to silicon nitride is controlled at 20:1. In other words, a greater portion of the liner 34 and a smaller or lesser portion of the dielectric layer 36 were removed during the aforementioned etching process, so that the top surface of the remaining dielectric layer 36 or top portion 30 of the STI 24 is even with or slightly higher than the bottom surface of the adjacent second trench 28. It should also be noted that even though the top surface of the top portion 30 is represented by a curve while the topmost or apex point of the curve or two valley points on two sides of the curve were all even with or higher than the bottom surface of the second trench 28, according to an embodiment of the present invention, it would also be desirable to adjust the parameter or recipe during the etching of the liner 34 and the dielectric layer 36 so that the top surface of the top portion 30 or the remaining dielectric layer 36 forms a completely planar surface and in such instance, the planar top surface would also be even with or higher than the bottom surface of the second trench 28, which are all within the scope of the present invention.

Next, as shown in FIGS. 4-5, an in-situ steam generation (ISSG) process is conducted to form a gate dielectric layer (not shown) in the first trench 26 and second trenches 28, and a work function metal layer 38 and a conductive layer 40 are formed on the gate dielectric layer. Next, an etching back process is conducted to remove part of the conductive layer 40 and part of the work function metal layer 38 so that the top surface of the remaining conductive layer 40 and work function metal layer 38 is slightly lower than the top surface of the substrate 16. This forms a first gate structure 42 in the first trench 26 and second gate structures 44 in the second trenches 28. Next, hard masks 46 are formed on the first gate structure 42 and second gate structures 44, in which the top surfaces of the hard masks 46 and the substrate 16 are coplanar.

In this embodiment, the gate dielectric layer preferably includes silicon oxide or high-k dielectric layer depending on the demand of the product, in which the high-k dielectric layer is preferably selected from dielectric materials having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The work function metal layer 38 could include n-type work function metal layer or p-type work function metal layer depending on the demand of the process or product. In this embodiment, n-type work function metal layer could include work function metal layer having a work function ranging between 3.9 eV and 4.3 eV such as but not limited to for example titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. P-type work function metal layer on the other hand could include work function metal layer having a work function ranging between 4.8 eV and 5.2 eV such as but not limited to for example titanium nitride (TiN), tantalum nitride (TaN), or tantalum carbide (TaC), but not limited thereto. The conductive layer 40 preferably includes low resistance material such as but not limited to for example Cu, Al, W, TiAl, CoWP, or combination thereof. The hard masks 46 preferably includes silicon nitride, but could also include other dielectric material such as but not limited to for example $SiO_2$, SiON, or SiCN.

Next, an ion implantation process could be conducted depending on the demand of the process to form a doped region (not shown) such as lightly doped drain or source/drain region in the substrate 16 adjacent to two sides of the first gate structure 42 or second gate structure 44. Next, a contact plug process could be conducted to form bit line contacts adjacent to two sides of the second gate structures 48 electrically connecting the source/drain region and bit lines formed thereafter and storage node contacts electrically connecting the source/drain region and capacitors fabricated in the later process.

Referring again to FIG. 4, FIG. 4 illustrates a structural view of a DRAM device according to an embodiment of the present invention. As shown in FIG. 4, the DRAM device 10 includes a first gate structure 42 in the substrate 16, at least a second gate structure 44 in the substrate 16 adjacent to the first gate structure 42, hard masks 46 on the first gate structure 42 and second gate structures 44, and a STI 24 disposed under the first gate structure 42.

Preferably, the STI 24 includes a top portion 30 and a bottom portion 32, in which the top surface of the top portion 30 is even with or slightly higher than the bottom surface of the second gate structure 44. Each of the first gate structure 42 and second gate structure 44 includes work function metal layer 38 and conductive layer 40, the top surfaces of the first gate structure 42 and second gate structures 44 are coplanar, and the top surface of the hard masks 46 is even with the top surface of the substrate 16.

Moreover, as disclosed in the aforementioned embodiment, even though the top surface of the top portion 30 is represented by a curve while the topmost or apex point of the curve or two valley points on two sides of the curve are all even with or higher than the bottom surface of the second gate structure 44, according to an embodiment of the present invention, the top surface of the top portion 30 of the STI 24 could also include a completely planar surface and in such instance, the planar top surface of the top portion 30 would also be even with or higher than the bottom surface of the adjacent second gate structure 44. In this embodiment, the top portion 30 and the bottom portion 32 of the STI 24 are preferably made of different material. For instance, the top portion 30 preferably includes silicon nitride and the bottom portion 32 preferably includes silicon oxide, but not limited thereto.

Referring again to FIG. 5, FIG. 5 illustrates a structural view of a DRAM device according to an embodiment of the present invention. As shown in FIG. 5, the DRAM device 10 includes a STI 24 in the substrate 16 and the STI 24 further includes a top portion 30 and a bottom portion 32. Preferably, the top surface of the top portion 30 is even with or higher than the top surface of the substrate 16 and the top surface of the bottom portion 32 is lower than the top surface of the substrate 16. Viewing from another perspective, the bottom portion 32 of the STI 24 is substantially U-shaped while the two vertical portions or sidewalls of the U-shaped bottom portion 32 are disposed between the top portion 30 and the substrate 16. In this embodiment, the top portion 30 and bottom portion 32 of the STI 24 are made of different material, in which the top portion 30 preferably includes silicon nitride while the bottom portion 32 includes silicon oxide, but not limited thereto.

Typically during the fabrication of the DRAM device, issues such as current leakage or cross-link typically arise when the gate structures (such as the first gate structures disclosed in the aforementioned embodiment) disposed on the STI is lower than the adjacent gate structures (such as the second gate structures disclosed in the aforementioned embodiment). The issue is commonly referred to as row hammer effect, which not only allows adjacent columns in a DRAM chip to induce bit inversion but also enables any other user to alter the storage content within the machine. To resolve this issue, the present invention preferably increases the overall height of the STI before gate structures are formed so that the top surface of the top portion of the STI would be at least even with or slightly higher than the adjacent trench used for forming gate structures. By following this approach, the bottom of the gate structure formed directly on top of the STI would be at least even with or higher than the adjacent gate structures or word lines and row hammer effect caused by electronic interference between adjacent gate lines could be reduced substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a first gate structure in a substrate;
a second gate structure in the substrate and adjacent to the first gate structure;
a shallow trench isolation (STI) under the first gate structure, wherein the STI comprises a bottom portion and a top portion directly under the first gate structure, two sidewalls of the top portion are aligned with two sidewalls of the first gate structure, and a topmost surface of the top portion is even with or higher than a bottom surface of the second gate structure and lower than a top surface of the substrate; and
a mask on each of the first gate structure and the second gate structure, wherein a top surface of the mask is even with the top surface of the substrate.

2. The semiconductor device of claim 1, wherein the top portion and the bottom portion comprise different material.

3. The semiconductor device of claim 1, wherein the top portion comprises silicon nitride and the bottom portion comprises silicon oxide.

4. The semiconductor device of claim 1, wherein a top surface of the first gate structure is even with a top surface of the second gate structure.

5. The semiconductor device of claim 1, wherein the topmost surface of the top portion comprises a curve.

* * * * *